United States Patent
Kurita et al.

(10) Patent No.: US 7,104,535 B2
(45) Date of Patent: Sep. 12, 2006

(54) METHODS AND APPARATUS FOR POSITIONING A SUBSTRATE RELATIVE TO A SUPPORT STAGE

(75) Inventors: Shinichi Kurita, San Jose, CA (US); Rex Kusler, Fremont, CA (US)

(73) Assignee: Applied Materials, Inc., Santa Clara, CA (US)

( * ) Notice: Subject to any disclaimer, the term of this patent is extended or adjusted under 35 U.S.C. 154(b) by 173 days.

(21) Appl. No.: 10/781,953

(22) Filed: Feb. 19, 2004

(65) Prior Publication Data

US 2004/0245956 A1 Dec. 9, 2004

Related U.S. Application Data

(60) Provisional application No. 60/448,855, filed on Feb. 20, 2003, provisional application No. 60/448,821, filed on Feb. 20, 2003, provisional application No. 60/448,972, filed on Feb. 20, 2003.

(51) Int. Cl.
    *B23Q 3/08* (2006.01)

(52) U.S. Cl. ..................... 269/303

(58) Field of Classification Search ........... 269/71, 269/303, 73, 254 CS; 355/73, 72, 75; 378/34, 378/35; 324/758; 359/392
    See application file for complete search history.

(56) References Cited

U.S. PATENT DOCUMENTS 4,628,238 A    12/1986  Smulders et al.
4,880,349 A  * 11/1989  Woodward .................... 29/743
6,158,946 A    12/2000  Miyashita
6,327,034 B1   12/2001  Hoover et al.
6,499,367 B1   12/2002  Saeki
2002/0051697 A1 5/2002  Ko et al.

FOREIGN PATENT DOCUMENTS

| EP | 1 067 589 A2 | 1/2001 |
| JP | 04149917 | 5/1992 |
| JP | 06204321 | 7/1994 |
| JP | 08313815 | 11/1996 |
| JP | 09152569 | 6/1997 |
| JP | 2001358202 | 12/2001 |
| JP | 2002308420 | 10/2002 |
| JP | 06089845 | 3/2004 |
| JP | 09090308 | 4/2004 |

* cited by examiner

*Primary Examiner*—Robert C. Watson
(74) *Attorney, Agent, or Firm*—Dugan & Dugan (57) ABSTRACT

An alignment device is provided that includes (1) a first pusher adapted to contact an edge of a substrate supported on a stage and to laterally translate along a first path; (2) a second pusher adapted to contact the substrate edge and to laterally translate along a second path that is at an angle to and intersects the first path; (3) a frame, to which the first and second pushers are movably coupled, adapted to maintain the first and second pushers at an elevation of the substrate edge; (4) a first biasing element coupled between the first pusher and the frame and adapted to bias the first pusher against the substrate edge; and (5) a second biasing element coupled between the second pusher and the frame and adapted to bias the second pusher against the substrate edge independent of the biasing of the first pusher. Other aspects are provided.

22 Claims, 6 Drawing Sheets

METHODS AND APPARATUS FOR POSITIONING A SUBSTRATE RELATIVE TO A SUPPORT STAGE

The present application claims priority from U.S. Provisional Patent Application No. 60/448,855, filed Feb. 20, 2003, which is hereby incorporated by reference herein in its entirety.

CROSS REFERENCE TO RELATED APPLICATIONS

The present application is related to the following co-pending U.S. Provisional Patent Applications:

U.S. Provisional Patent Application Ser. No. 60/448,821, filed Feb. 20, 2003, and titled "METHODS AND APPARATUS FOR DETERMINING A POSITION OF A SUBSTRATE RELATIVE TO A SUPPORT STAGE"; and U.S. Provisional Patent Application Ser. No. 60/448,972, filed Feb. 20, 2003, and titled "METHODS AND APPARATUS FOR POSITIONING A SUBSTRATE RELATIVE TO A SUPPORT STAGE".

Each of these provisional patent applications is hereby incorporated by reference herein in its entirety.

FIELD OF THE INVENTION

The present invention relates generally to substrate processing, and more particularly to positioning a substrate relative to a support stage.

BACKGROUND OF THE INVENTION

During the manufacture of flat panel displays, a glass substrate may be placed on a support stage for processing and/or testing purposes. Typical substrate processing may include lithography, deposition, etching, annealing, etc., and typical substrate testing may include verifying the operation of thin film transistors formed on the substrate, e-beam inspection, defect detection, etc.

To accurately identify device and/or substrate locations for processing and/or testing, and/or to reduce device/location search times, a position of a substrate relative to a support stage should be determined. Accordingly, improved methods and apparatus for quickly and accurately positioning a substrate relative to a support stage would be desirable.

SUMMARY OF THE INVENTION

In a first aspect of the invention, an alignment device is provided that is adapted to laterally urge a substrate supported on a support stage so as to cause the substrate to slide relative to the support stage. The alignment device includes (1) a first pusher adapted to contact an edge of a substrate supported on the support stage and to laterally translate along a first path of translation; (2) a second pusher adapted to contact the edge of the substrate and to laterally translate along a second path of translation, the second path of translation being at an angle to the first path of translation and intersecting the first path at a path intersection; (3) a frame to which the first and second pushers are movably coupled, the frame adapted to maintain the first and second pushers at an elevation of the edge of the substrate supported on the support stage; (4) a first biasing element coupled between the first pusher and the frame and adapted to bias the first pusher against the edge of the substrate; and (5) a second biasing element coupled between the second pusher and the frame and adapted to bias the second pusher against the edge of the substrate independent of the biasing of the first pusher.

In a second aspect of the invention, a substrate calibration system is provided that includes a plurality of alignment devices arranged in a spaced relation around a support stage. Each of the plurality of alignment devices comprises (1) a first pusher adapted to contact an edge of a substrate supported on the support stage and to laterally translate along a first path of translation; (2) a second pusher adapted to contact the edge of the substrate and to laterally translate along a second path of translation, the second path of translation being at an angle to the first path of translation and intersecting the first path at a path intersection; (3) a frame to which the first and second pushers are movably coupled, the frame adapted to maintain the first and second pushers at an elevation of the edge of the substrate supported on the support stage; (4) a first biasing element coupled between the first pusher and the frame and adapted to bias the first pusher against the edge of the substrate; and (5) a second biasing element coupled between the second pusher and the frame and adapted to bias the second pusher against the edge of the substrate independent of the biasing of the first pusher. Numerous other aspects are provided, as are methods and apparatus in accordance with these and other aspects of the invention.

Other features and aspects of the present invention will become more fully apparent from the following detailed description of exemplary embodiments, the appended claims and the accompanying drawings.

DETAILED DESCRIPTION

Conventional manufacturing methods for the production of glass substrates, e.g. for use in flat panel displays and other applications, may produce substrates that vary in size. For example, a glass substrate having nominal width and length dimensions of 1 meter×1.2 meter may have a variation of up to +/−0.5 millimeters per side or more.

Such variation in glass substrate dimensions can cause problems during device processing and/or testing. For example, a lithographic system may rely on one or more electron beams (e-beams) to search for registration marks on the surface of a substrate during mask alignment. An e-beam will function best when the surface area of the substrate within which the e-beam is expected to scan, e.g. in order to find a particular registration mark therein, is minimized. However, variations in substrate size, as described above, tend to increase the area in which an e-beam must scan in order to locate registration marks. Any increase in e-beam scanning area may increase the time required to locate registration marks. Since the printing of a mask on the surface of a substrate must be delayed until proper alignment is established, longer scan times directly affect the efficiency of the lithographic process. Moreover, long e-beam scanning times may damage devices formed on a substrate due to excessive charge that may build up during the e-beam scanning process.

In a first aspect of the present invention, the methods and apparatus disclosed herein are adapted to subject a substrate placed on a support stage, which can be a test stage or other type of substrate processing stage, to positional and/or orientational adjustment relative to the support stage. Preferably, positioning and/or orientation of the substrate in accordance with the first aspect of the invention will result in at least rough alignment of the substrate relative to a known position and orientation of the support stage. In a particular embodiment, such rough alignment may be performed despite variations in substrate size, thereby reducing and/or minimizing e-beam scan areas and/or scan times during lithographic processing. As described further below, such substrate alignment may be performed quickly and inexpensively, and may be employed with other substrate processing steps and/or during device testing.

Figure 1:
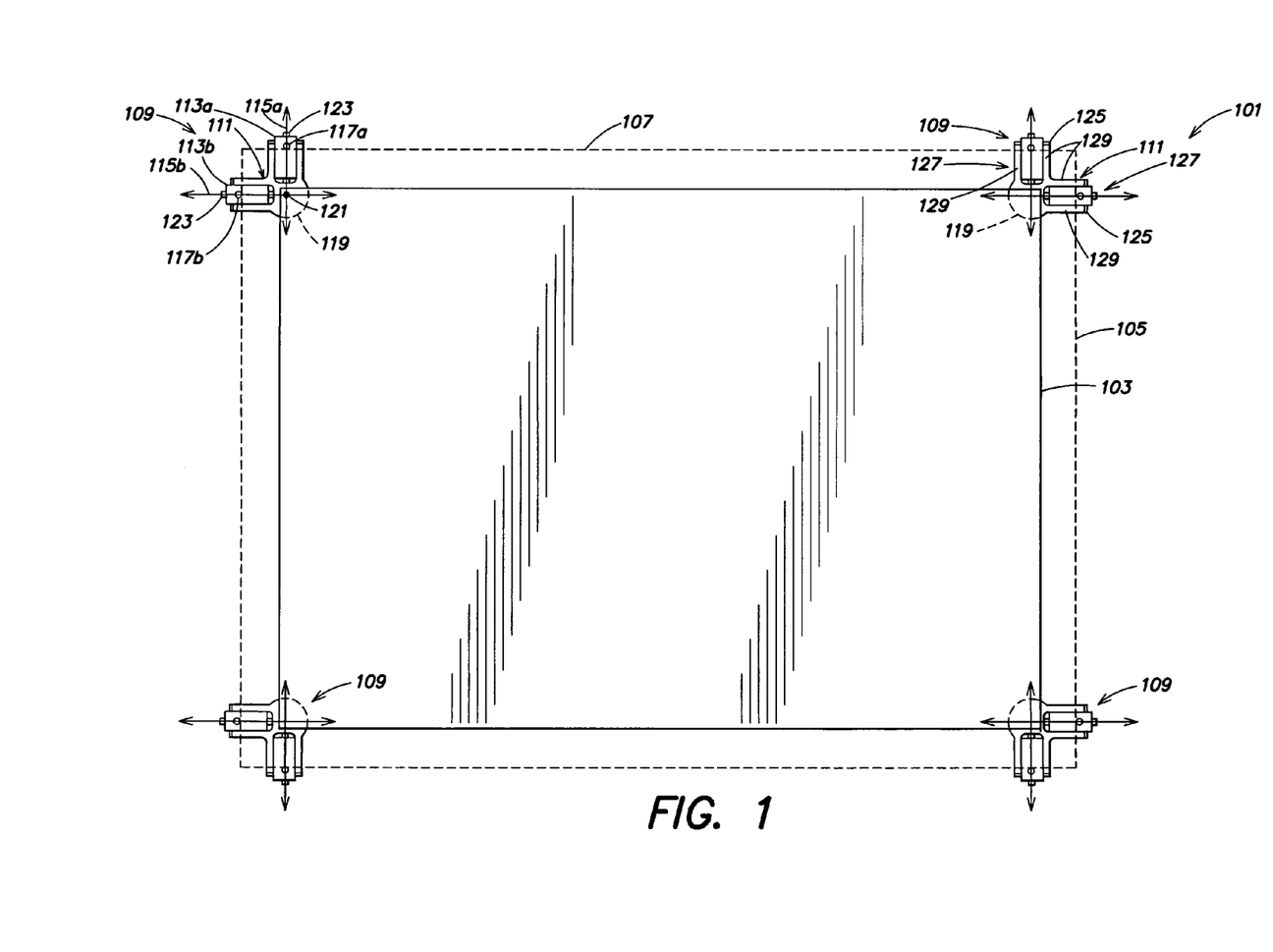
FIG. 1 is a schematic top view of an exemplary embodiment of a substrate calibration system in accordance with the present invention.

FIG. 1 is a schematic top view of an exemplary embodiment of a substrate calibration system 101 in accordance with the present invention. The substrate calibration system 101 is shown positioned adjacent a support stage 103 that supports a substrate 105 having an edge 107.

In the embodiment of FIG. 1, the substrate calibration system 101 comprises four alignment devices (e.g., pushing devices 109) arranged in a spaced relation around the support stage 103. Few or more pushing devices may be employed. Each pushing device 109 is positioned adjacent a corner of the support stage 103 (alternative positions are also acceptable, such as adjacent a side of the support stage 103). Each pushing device 109 includes a first and a second pusher support 113a, 113b, the first pusher support 113a being adapted to move relative to the frame 111 of the pushing device 109 along a first translation path 115a (and to contact the substrate 105 via a first pusher 117a), and the second pusher support 113b being adapted to move relative to the frame 111 of the pushing device 109 along a second translation path 115b (and to contact the substrate 105 via a second pusher 117b). The frame 111 of each pushing device 109 may include a hub portion 119 (e.g., generally located at a path intersection point 121 where the first translation path 115a and the second translation path 115b intersect). Other configurations for the frame 111 of the pushing device 109 may also be employed, e.g. wherein no portion of the frame 111 is located at the path intersection point 121.

Also as shown in FIG. 1, the hub portion 119 of the frame 111 of the pushing device 109 may be positioned and configured so as to be wholly or partially beneath the substrate 105. Furthermore the hub portion 119 may be positioned and configured so as to be wholly or partially beneath the support stage 103. It will be apparent therefore that if the presence of the substrate calibration system 101 increases the footprint of the overall system (e.g. as might be primarily established by the breadth and length of the support stage 103 in a given processing or inspection tool), such an increase may be minimized and/or relatively small compared to the footprint of the support stage 103.

Movement of each pusher support 113 relative to the frame 111 of the pushing device 109 can be facilitated by a guide shaft 123. Each guide shaft 123 may be used to define a translation path 115, and in the case when a translation path 115 is linear, the guide shaft 123 may also be straight. In other embodiments, the guide shaft 123 may deviate from straight, depending on the desired shape of the translation path 115. In the example of FIG. 1 each pushing device 109 comprises two guide shafts 123, and an end of each guide shaft 123 is coupled to the hub portion 119 of the frame 111 of the pushing device 109. Other arrangements may also be employed, e.g. wherein the frame 111 is coupled to both ends of one or both guide shafts 123.

Each pushing device 109 may further be adapted to confine the movement of each pusher support 113 along its translation path 115 to within a predefined range (e.g., a first and second predefined range, respectively). For example, as shown in FIG. 1, the pushing device 109 may further comprise a stop plate 125 (shown in profile) coupled to the frame 111 of the pushing device 109 adapted to perform such a function. In the example of FIG. 1, each pushing device 109 comprises two stop plates 125, and each stop plate 125 is coupled to the frame 111 of the pushing device 109 via a projection portion 127 of the frame 111 that extends outward from the hub portion 119 of the frame 111. While two projection portions 127 are shown in FIG. 1, it will be understood that more or fewer than two projections may be employed.

In operation, the substrate calibration system 101 of FIG. 1 is adapted to allow the substrate 105 to be loaded onto the support stage 103 by moving the pushers 117 of the pushing devices 109 generally away from the support stage 103 (e.g., via translation of the pusher supports 113). Thereafter, the substrate 105 may be loaded onto the support stage 103 and the pushers 117 may be moved toward the edge 107 of the substrate 105 so as to calibrate the substrate 105 relative to the support stage 103. Further details regarding modes of operating the pushing devices 109 of the substrate calibration system 101 are discussed below with reference to FIGS. 2A–2C.

Figure 2A:
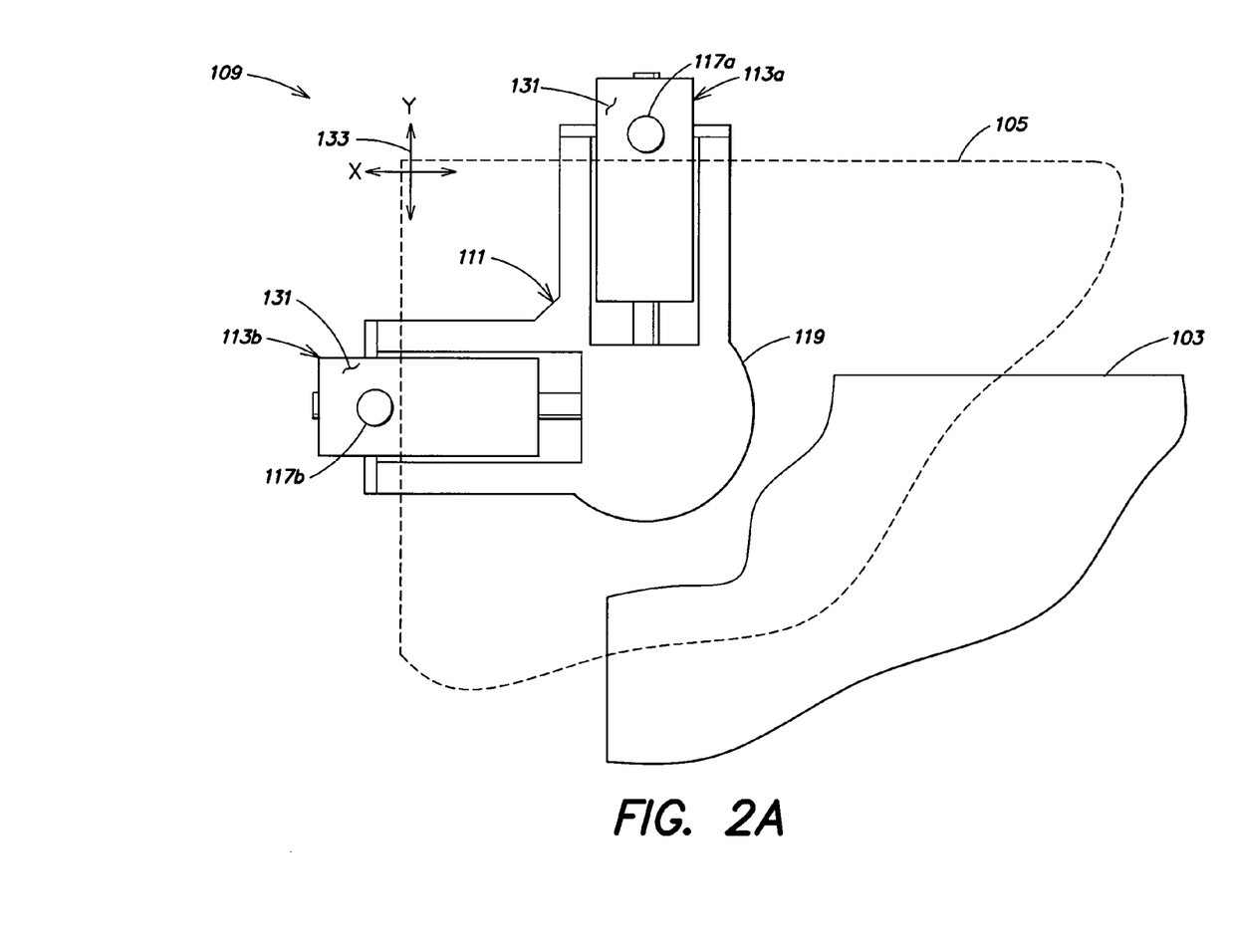
FIG. 2A is a schematic top view of one of the pushing devices of FIG. 1 wherein pushers of the pushing device are retracted away from a hub portion of the frame of the pushing device.

FIG. 2A is a schematic top view of one of the pushing devices 109 of FIG. 1 wherein the pushers 117 of the pushing device 109 are retracted away from the hub portion 119 of the frame 111 of the pushing device 109. When the pushers 117 are so positioned, the substrate 105 may be placed on or unloaded from the support stage 103. In a particular embodiment, the substrate 105 of FIG. 2A is in contact with the support stage 103 only. In such an embodiment the pushing device 109 may be further configured such that the remainder of the pushing device 109 (other than the pushers 117) is spaced apart from and below the substrate 105 so as to facilitate loading and unloading of the substrate 105 with respect to the support stage 103. Other embodiments provided for the substrate 105 of FIG. 2A to contact both the support stage 103 and a top surface 131 of one or both of the pusher supports 113 of the pushing device 109 so as to provide additional support to the substrate 105. (Note that in FIG. 2A, the substrate 105 still requires calibration to the support stage 103, e.g. such that the edge 107 of the substrate 105 will thereafter be aligned with an x-y coordinate system 133 of the support stage 103.)

Figure 2B:
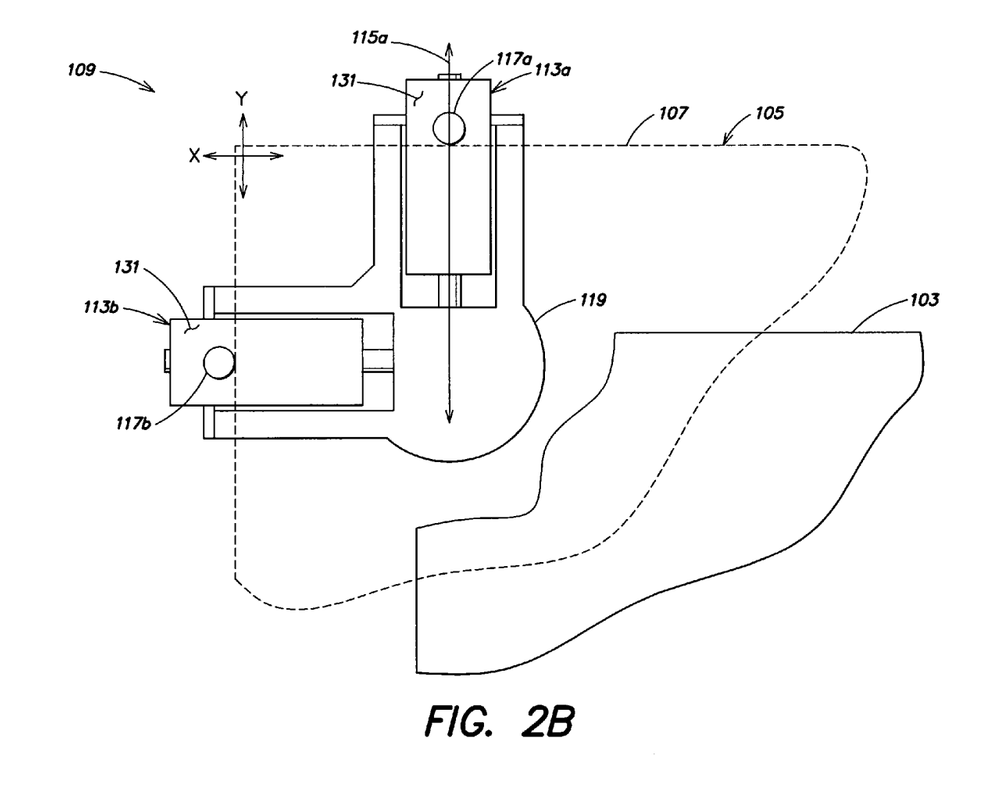
FIG. 2B is a schematic top view of one of the pushing devices of FIG. 1 wherein the pushers of the pushing device are in contact with the edge of a substrate prior to calibration of the substrate relative to a support stage.

FIG. 2B is a schematic top view of one of the pushing devices 109 of FIG. 1 wherein the pushers 117 of the pushing device 109 are in contact with the edge 107 of the substrate 105 prior to calibration of the substrate 105 relative to the support stage 103. For example, each pusher 117 has moved along its respective translation path 115 from a retracted position as shown in FIG. 2A and toward the support stage 103 at least as far as is necessary to achieve contact with the edge 107 of the substrate 105 as the substrate 105 rests on the support stage 103. As mentioned above, the substrate 105, as it appears in FIG. 2B, may also be in contact with the top surface 131 of one or both of the pusher supports 113. Alternatively, contact between the substrate 105 and the pushing device 109 may be confined to the pushers 117. Surfaces of the pushing device 109 that contact the substrate 105 (e.g. vertical surfaces the pushers 117 and/or the top surface 131 of the pusher supports 113), and/or the surface of the support stage 103 that supports the substrate 105, may be treated so as to promote smooth sliding therebetween and to protect against scratching a surface of the substrate 105. For example, such surfaces may be coated with Teflon® (e.g., polytetrafluoroethylene), or with a similar low-friction coating material. Such a low-friction coating may be advantageous when a substrate must slide against a pusher 117 during positioning/calibration of the substrate to the support stage 103.

Figure 2C:
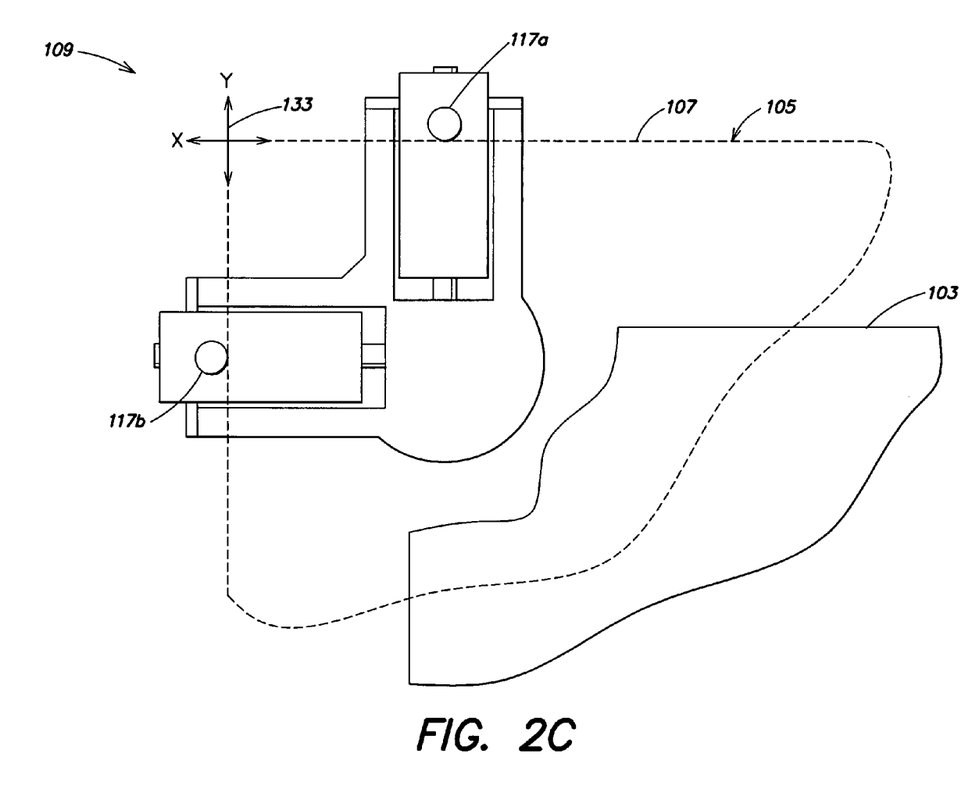
FIG. 2C is a schematic top view of one of the pushing devices of FIG. 1 wherein the substrate has been calibrated relative to the support stage.

FIG. 2C is a schematic top view of one of the pushing devices 109 of FIG. 1 wherein the substrate 105 has been calibrated relative to the support stage 103 (e.g., via the pushers 117 contacting and pushing the edge 107 of the substrate 105). That is, the edge 107 of the substrate 105 is aligned with an x-y coordinate system 133 of the support stage 103. In one or more embodiments, the substrate calibration system 101 (FIG. 1) is adapted to calibrate the substrate 105 to the support stage 103 by confining and/or enclosing the substrate 105 within a perimeter (not separately shown) defined by the pushers 117. In some such embodiments, it is not necessary for any of the pushers 117 to continue to push against the edge 107 of the substrate 105 once the substrate 105 is within the perimeter. In yet another embodiment, the substrate calibration system 101 and the support stage 103 can be moved in tandem during processing or inspection, with the substrate 105 continuing to be confined within the perimeter defined by the pushers 117. In other such embodiments, one or more of the pushers 117 may continue to push against the edge 107 of the substrate 105, providing a further measure of confinement for applications that require the same (whether or not the support stage 103 may be moved in tandem with the substrate calibration system 101).

Figure 3:
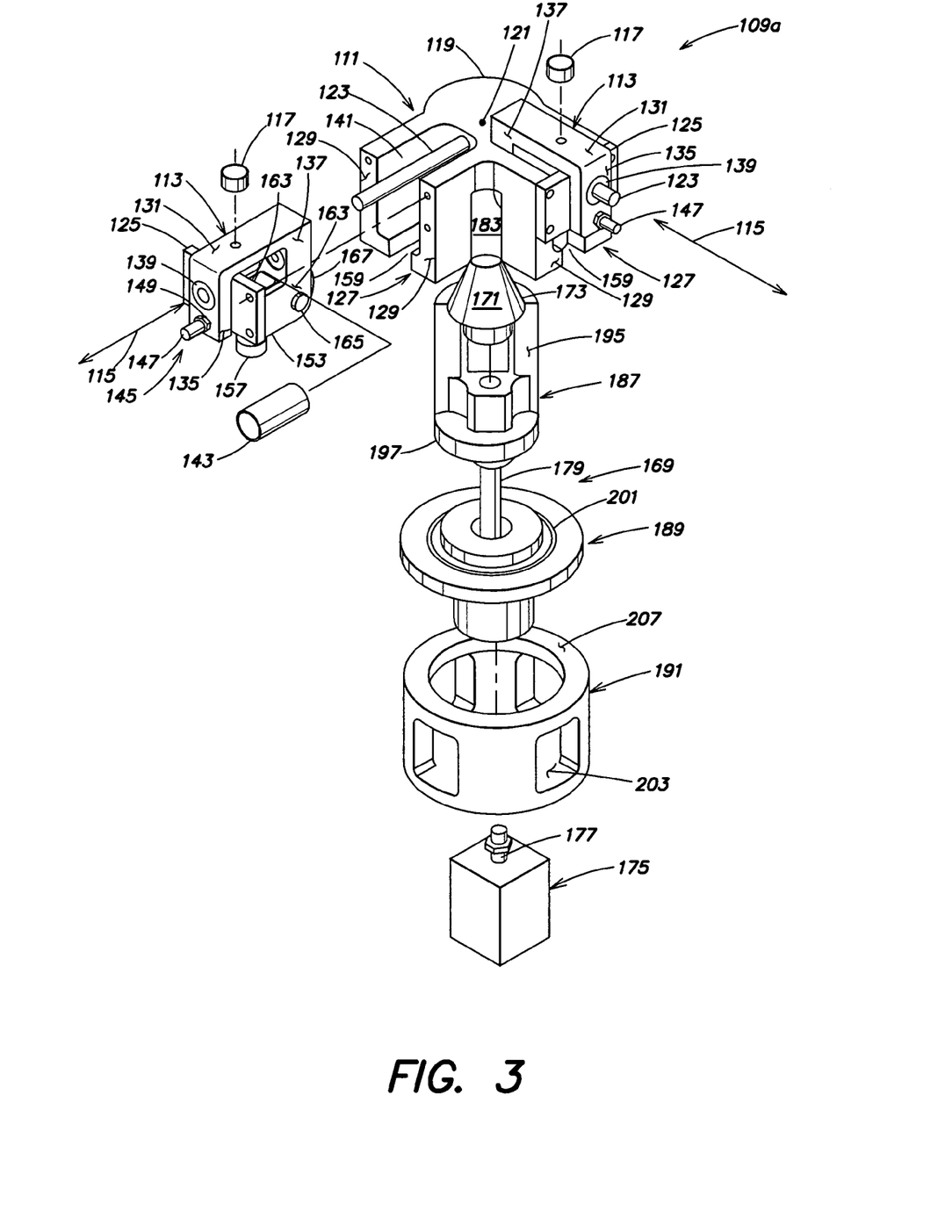
FIGS. 3 and 4 are, respectively, a perspective exploded assembly view, and a cross-sectional side view of a pushing device that comprises an exemplary embodiment of the pushing devices of FIGS. 1 and 2A–2C.
Figure 4:
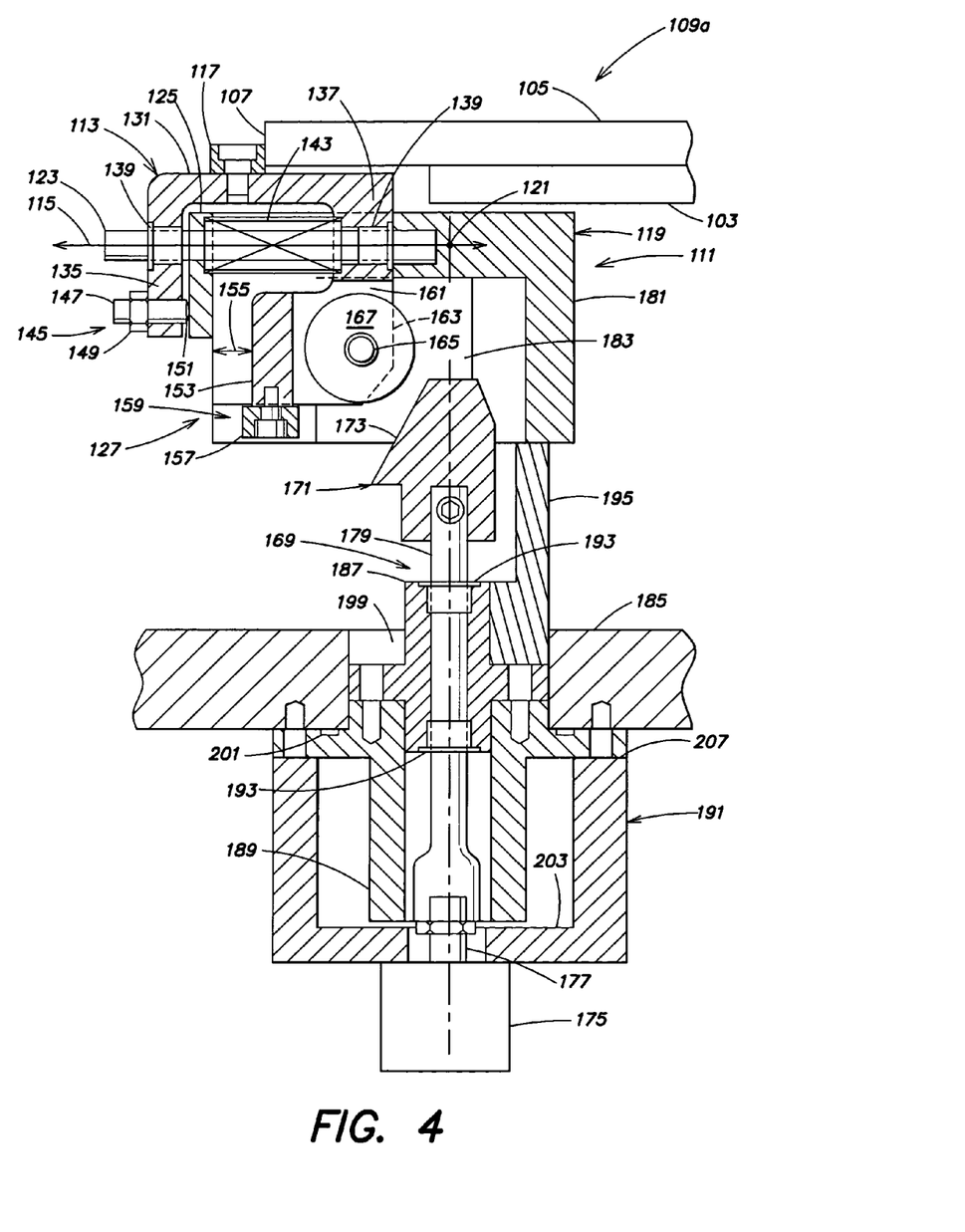

FIGS. 3 and 4 are, respectively, a perspective exploded assembly view, and a cross-sectional side view of a pushing device 109a that comprises an exemplary embodiment of the pushing devices 109 of FIGS. 1 and 2A–2C.

With reference to FIGS. 3 and 4, the pushing device 109a comprises a frame 111 and two pusher supports 113 movably coupled to the frame 111. Each pusher support 113 is adapted to move relative to the frame 111 along a linear translation path 115. The pushing device 109a further includes two pushers 117, one each pusher 117 coupled to the top surface 131 of one of the pusher supports 113 for movement relative to the frame 111 along the translation path 115. The frame 111 includes a hub portion 119 generally located at a path intersection point 121 where the translation paths 115 of the pusher supports 113 and the pushers 117 intersect. The pushing device 109a further includes two guide shafts 123 coupled to the hub portion 119 of the frame 111 of the pushing device 109a. For example, each guide shaft 123 may extend from the hub portion 119 in a cantilevered arrangement. Each guide shaft 123 is adapted to guide one of the pusher supports 113 along the translation path 115 of the pusher support 113. For example, each pusher support 113 may comprises a first and a second downward-extending portion 135, 137, each including a hole within which may be disposed a shaft bearing 139 for facilitating smooth movement of the pusher support 113 along the guide shaft 123.

The frame 111 of the pushing device 109a further includes two projection portions 127, each projection portion 127 enclosing one of the guide shafts 123 within an open enclosure 141. The pushing device 109a also includes two stop plates 125, one stop plate 125 coupled to a different one of the projection portions 127 and forming an end boundary for its respective open enclosure 141.

The pushing device 109a further includes two biasing elements 143, one biasing element 143 being extensibly coupled within each open enclosure 141 between the stop plate 125 and the second downward-extending portion 137 of the pusher support 113 that is located within the open enclosure 141. It will be apparent that each biasing element 143 of the pushing device 109 is adapted to (1) push against a stop plate 125, which is preferably fixedly coupled to the frame 111; (2) extend within an open enclosure 141 toward the hub portion 119; and (3) move the pusher support 113 and the pusher 117 along a guide shaft 123 (and along the translation path 115 defined by the guide shaft 123) toward the hub portion 119 as the biasing element 143 so extends. In this manner each pusher support 113 and pusher 117 may be moved from a retracted position (FIG. 2A) to a contact position relative to the edge 107 of the substrate 105 (FIG. 2B) and finally to an extended position (FIG. 2C). Referring specifically to FIG. 4, one of the pusher supports 113 and one of the pushers 117 of the pushing device 109a are shown in a fully-extended position. As shown in FIG. 4, the pushing device 109a may comprise one or more adjustable spacing mechanisms 145. Each spacing mechanism 145 is adapted to establish a limit to which a pusher support 113 may be moved along a guide shaft 123 toward the hub portion 119 under the force of a biasing element 143 (e.g., to establish a fully-extended position of the pusher support 113 and its pusher 117). In the specific example of FIG. 4, the spacing mechanism 145 comprises a setscrew 147 occupying a threaded through-hole that perforates the first downward-extending portion 135 of the pusher support 113, and a nut 149 coupled to the setscrew 147 for adjustably setting the length of the setscrew 147 that extends beyond the first downward-extending portion 135 and toward the stop plate 125. As shown in FIG. 4, an end 151 of the setscrew 147 is adapted to contact the stop plate 125, preventing any further motion of the pusher support 113 toward the hub portion 119. Any other configuration for limiting motion of the pusher support 113 and/or pusher 117 similarly may be employed.

Referring to FIGS. 3 and 4, the pushing device 109a may be further adapted to establish a limit to which a pusher support 113 may be moved along a guide shaft 123 away from the hub portion 119 against the force of a biasing element 143 (e.g., to establish a fully-retracted position of the pusher support 113 and its pusher 117). For example, each pusher support 113 of the pushing device 109a may comprise a lower portion 153, adapted to contact the stop plate 125, and to prevent further motion of the pusher support 113 away from the hub portion 119. As illustrated in FIG. 4, when the pusher support 113 is in a fully-extended position, the lower portion 153 of the pusher support 113 is spaced apart from the stop plate 125 by a first distance 155 (e.g., the maximum range of motion (not separately shown) of the pusher support 113 along the guide shaft 123).

The pushing device 109a may also be adapted to substantially prevent rotation of the pusher support 113 relative to the frame 111, e.g. as the pusher support 113 moves relative to the frame 111 along the translation path 115. For example, each pusher support 113 may comprise a guidepin 157 coupled to the lower portion 153 of the pusher support 113 and extending downward from the lower portion 153. Each projection portion 127 may be shaped so as to define a guide channel 159 for retaining the guidepin 157 as the pusher support 113 moves along the translation path 115.

The pushing device 109a may be adapted to retract each pusher support 113 away from the hub portion 119 of the frame 111 of the pushing device 109a against the force of the biasing element 143 associated with each pusher support 113 so as to cause each pusher support 113 to assume the fully-retracted position described above. For example, each pusher support 113 may include an open area 161 (FIG. 4) between the second downward-extending portion 137 and the lower portion 153 of the pusher support 113 and defined in part by a pair of wall portions 163 that span the distance between and connect the second downward-extending portion 137 and the lower portion 153. An axle 165 may be coupled to each wall portion 163 and a rotary member 167 such as a roller wheel may be rotatably mounted on the axle 165 within the open area 161.

Furthermore the pushing device 109a may comprise a plunger 169 or similar retraction device adapted to urge each pusher support 113 away from the hub portion 119 by interacting with the rotary member 167 of each pusher support 113. For example, the plunger 169 may comprise a plunger head 171 having an inclined surface 173, and the plunger 169 may be pushed upward so as to cause the rotary member 167 of each pusher support 113 to roll along the inclined surface 173 as the plunger head 171 moves upward. In this manner, each pusher support 113 will be displaced (along with each rotary member 167) outward from the hub portion 119 of the frame 111. For this purpose the pushing device 109a may further comprise an actuator 175, e.g. a linear actuator such as a motor or pneumatically-driven actuator, adapted to retractably extend a pusher 177 upward, so as to push a shaft 179 of the plunger 169 upward, causing the above-described outward displacement of each rotary member 167.

As stated above, the pushing device 109a may be adapted to utilize the plunger 169 and the actuator 175 to retract both pusher supports 113 simultaneously. For example, the shaft 179 of the plunger 169 may be vertically aligned beneath the path intersection point 121 where the translation paths 115 of the pusher supports 113 and the pushers 117 intersect. A downward-extending portion 181 (FIG. 4) of the hub portion 119 of the frame 111 may at least partially define a plunger head insertion chamber 183 of the pushing device 109a for accommodation of the plunger head 171 of the plunger 169 as the plunger 169 is retractably extended upward. As best seen in FIG. 4, the plunger head insertion chamber 183 may be further defined by each projection portion 127 of the frame 111; and the rotary member 167 of each pusher support 113 may be adapted to project, at least partially, into the plunger head insertion chamber 183 such that rolling communication between the rotary member 167 and the inclined surface 173 of the plunger head 171 may be achieved.

For precise positioning and alignment of the pushing device 109a relative to the support stage 103 and for secure mounting of the pushing device 109a to a mounting member such as the chamber bottom 185 shown in FIG. 4, the pushing device 109a may include a shaft alignment member 187, a chamber interface 189, and an actuator mounting frame 191. The shaft alignment member 187 may include shaft bearings 193 for guiding the vertical movement of the shaft 179 of the plunger 169.

The shaft alignment member 187 may include an upward-extending portion 195 for mating with the downward-extending portion 181 of the hub portion 119 of the frame 111, and for establishing a proper elevation of the pushers 117 of the pushing device 109a relative to the edge 107 of the substrate 105 (and/or of the hub portion 119 of the frame 111 relative to the support stage 103, as shown in FIG. 4). In one or more embodiments, the shaft alignment member 187 may also include a machined cylindrical surface 197 so that the shaft alignment member 187 may be inserted into a machined through-hole 199 (FIG. 4) that penetrates the chamber bottom 185 and be precisely located therein. The chamber bottom 185 may include multiple such holes (not separately shown) arranged in a pattern (not separately shown) around the support stage 103 (FIG. 1) so as to facilitate precise calibration of the substrate 105 relative to the support stage 103.

The chamber interface 189 may couple to the shaft alignment member 187, as well as attach to a surface of the chamber bottom 185 such that a sealing ring (not shown) residing in a channel 201 formed within the chamber interface 189 seals the interface between the chamber bottom 185 and the chamber interface 189. As well, the actuator mounting frame 191 may comprise a surface 203 to which the actuator 175 may be mounted and through which the pusher 177 of the actuator 175 may be inserted, and a coupling portion 207 so the actuator mounting frame 191 may be coupled to the chamber interface 189 and/or fixed in place relative to the machined through-hole 199 of the chamber bottom 185.

In operation, the pushing device 109a of FIGS. 3 and 4 may be operated in accordance with a substrate pushing mode wherein the pushing device 109a applies forces to the edge 107 of the substrate 105 along two different directions, each such direction coinciding with a direction of a translation path 115 through which the pushing device 109a moves a pusher support 113 and a pusher 117. In one embodiment, the pushing device 109a applies a first force to the edge 107 of the substrate 105 along a first direction, applies a second force to the edge 107 along a second direction that is substantially perpendicular to the first direction, and moves the substrate 105 relative to the support stage 103, e.g. based on a combination of the first and second forces. The first and second forces may be generated by the biasing element 143 of each pusher support 113 (FIGS. 1A–3) and may be transmitted to the edge 107 of the substrate 105 via the pushers 117.

As described above, the pushing device 109a moves each pusher support 113 along a translation path 115 toward the hub portion 119 of the frame 111 under the force of a biasing element 143. The motion of each pusher support 113 toward the hub portion 119 may continue until an equal and opposite force prevents further such motion. This force may be supplied in a number of different ways. For example, the substrate 105 may stop at a position relative to the support stage 103 at which multiple pushers 117 are pushing the edge 107 of the substrate 105 in different directions (e.g., such that all of the different direction lateral forces generated by and/or through the pushers 117 are balanced). Alternatively the substrate 105 may stop at a position relative to the support stage 103 at which all of the pusher supports 113 (and/or pushers 117) have reached a fully extended position (as shown in FIG. 4). In the latter circumstance, the substrate 105 may be adequately calibrated to the support stage 103 even though positive location of the edge 107 of the substrate 105 to a physical barrier or stop may not have been achieved. For example, the edge 107 of the substrate 105 may then be within a perimeter established by fully-extended pushers 117.

In at least one embodiment of the invention, the substrate calibration system 101 (FIG. 1) may comprise four pushing devices 109 that contact a substrate near its four corners (e.g., at a total of eight locations). In one aspect, such a system may position the substrate accurately to within about 0.3 mm. Probes or other measuring devices may be coupled to one or more pushing devices 109 so as to be "pre-aligned" with a substrate positioned by the pushing devices 109. Note that each pusher support 113 and/or pusher 117 may extend independently, and by an amount that is independent, of other pusher supports 113 (whether the other pusher supports are part of the same pushing device 109 or another pushing device 109).

The pushing device 109 may also be operated in a pusher retraction mode wherein the actuator 175 of the pushing device 109a pushes the shaft 179 of the plunger 169 upward. The plunger head 171, being moved upward within the plunger head insertion chamber 183 of the hub portion 119, contacts the rotary member 167 of each pusher support 113 and displaces the rotary member 167 outward from the hub portion 119 while the rotary member 167 rolls along the inclined surface 173 of the plunger head 171. The upward motion of the plunger head 171 may continue and thereby move each pusher support 113 away from the hub portion 119 along its translation path 115, e.g. until the lower portion 153 of the pusher support 113 contacts the stop plate 125. The pushers 117 will then be fully retracted and a substrate may be loaded onto or removed from the stage 103 by any number of means, e.g. one or more human operators, a robot equipped with an end effector or the like.

The forgoing description discloses only exemplary embodiments of the invention; modifications of the above-disclosed apparatus and methods which fall within the scope of the invention will be readily apparent to those of ordinary skill in the art. For example, while the present invention has been described primarily with regard to adjusting the position of glass plates relative to a support stage, it will be understood that the present invention may be employed to adjust the position of other types of substrates. A controller (not shown), such as an appropriately programmed microprocessor or microcontroller, may be coupled to the actuator 175 of each pushing device 109 and adapted to control retraction and extension of the pushers 117 as described above.

Accordingly, while the present invention has been disclosed in connection with exemplary embodiments thereof, it should be understood that other embodiments may fall within the spirit and scope of the invention, as defined by the following claims.

The invention claimed is:

1. An alignment device adapted to laterally urge a substrate supported on a support stage so as to cause the substrate to slide relative to the support stage, comprising:
   a first pusher adapted to contact an edge of a substrate supported on the support stage and to laterally translate along a first path of translation;
   a second pusher adapted to contact the edge of the substrate and to laterally translate along a second path of translation, the second path of translation being at an angle to the first path of translation and intersecting the first path at a path intersection;
   a frame to which the first and second pushers are movably coupled, the frame adapted to maintain the first and second pushers at an elevation of the edge of the substrate supported on the support stage;
   a first biasing element coupled between the first pusher and the frame and adapted to bias the first pusher against the edge of the substrate;
   a second biasing element coupled between the second pusher and the frame and adapted to bias the second pusher against the edge of the substrate independent of the biasing of the first pusher; and
   a pusher retraction device adapted to cause at least one of the first and second pushers to move away from the support stage.

2. The alignment device of claim 1, wherein at least a portion of the second path of translation is perpendicular to at least a portion of the first path of translation.

3. The alignment device of claim 1, wherein the pusher retraction device is further adapted to cause both the first and the second pushers to move away from the support stage.

4. The alignment device of claim 1 wherein the first and second pushers are adapted to laterally translate relative to the frame.

5. The alignment device of claim 1 further comprising:
   a first guide shaft adapted to define the first path of translation; and
   a second guide shaft adapted to define the second path of translation.

6. The alignment device of claim 1 further comprising:
   a first pusher support coupled to the first pusher and movably coupled to the frame and adapted to move along the first path of translation;
   a second pusher support coupled to the second pusher and movably coupled to the frame and adapted to move along the second path of translation;
   a first stop plate coupled to the frame and adapted to limit movement of the first pusher support along the first path of translation away from the support stage; and
   a second stop plate coupled to the frame and adapted to limit movement of the second pusher support along the second path of translation away from the support stage.

7. The alignment device of claim 1 wherein the first and second pushers are further adapted to allow the substrate to be loaded onto the support stage by translating away from the support stage.

8. The alignment device of claim 7 further comprising:
   a first pusher support coupled to the first pusher and movably coupled to the frame and adapted to move along the first path of translation;
   a second pusher support coupled to the second pusher and movably coupled to the frame and adapted to move along the second path of translation;
   a first spacing mechanism adapted to establish a limit to which the first pusher support may move along the guide shaft toward the support stage; and
   a second spacing mechanism adapted to establish a limit to which the second pusher support may move along the guide shaft toward the support stage.

9. The alignment device of claim 1 further comprising:
   a first pusher support coupled to the first pusher and movably coupled to the frame and adapted to move along the first path of translation;
   a second pusher support coupled to the second pusher and movably coupled to the frame and adapted to move along the second path of translation; and
   a plunger adapted to urge the first and second pusher supports away from the support stage.

10. A substrate calibration system, comprising:
a plurality of alignment devices arranged in a spaced relation around a support stage, wherein each of the plurality of alignment devices comprises:
- a first pusher adapted to contact an edge of a substrate supported on the support stage and to laterally translate along a first path of translation;
- a second pusher adapted to contact the edge of the substrate and to laterally translate along a second path of translation, the second path of translation being at an angle to the first path of translation and intersecting the first path at a path intersection;
- a frame to which the first and second pushers are movably coupled, the frame adapted to maintain the first and second pushers at an elevation of the edge of the substrate supported on the support stage;
- a first biasing element coupled between the first pusher and the frame and adapted to bias the first pusher against the edge of the substrate;
- a second biasing element coupled between the second pusher and the frame and adapted to bias the second pusher against the edge of the substrate independent of the biasing of the first pusher; and
- a pusher retraction device adapted to cause at least one of the first and second pushers to move away from the support stage.

11. The substrate calibration system of claim 10 wherein each of the plurality of alignment devices is positioned adjacent a corner of the support stage.

12. The substrate calibration system of claim 10 wherein the plurality of alignment devices are adapted to align the substrate with an x-y coordinate system of the support stage by confining the substrate within a perimeter defined by the first and second pushers of the plurality of alignment devices.

13. The alignment device of claim 10, wherein the pusher retraction device is further adapted to cause both the first and the second pushers to move away from the support stage.

14. The alignment device of claim 10 wherein the first and second pushers are adapted to laterally translate relative to the frame.

15. The alignment device of claim 10 further comprising:
a first guide shaft adapted to define the first path of translation; and
a second guide shaft adapted to define the second path of translation.

16. The alignment device of claim 10 further comprising:
a first pusher support coupled to the first pusher and movably coupled to the frame and adapted to move along the first path of translation;
a second pusher support coupled to the second pusher and movably coupled to the frame and adapted to move along the second path of translation;
a first stop plate coupled to the frame and adapted to limit movement of the first pusher support along the first path of translation away from the support stage; and
a second stop plate coupled to the frame and adapted to limit movement of the second pusher support along the second path of translation away from the support stage.

17. The alignment device of claim 10 wherein the first and second pushers are further adapted to allow the substrate to be loaded onto the support stage by translating away from the support stage.

18. The alignment device of claim 17 further comprising:
a first pusher support coupled to the first pusher and movably coupled to the frame and adapted to move along the first path of translation;
a second pusher support coupled to the second pusher and movably coupled to the frame and adapted to move along the second path of translation;
a first spacing mechanism adapted to establish a limit to which the first pusher support may move along the guide shaft toward the support stage; and
a second spacing mechanism adapted to establish a limit to which the second pusher support may move along the guide shaft toward the support stage.

19. The alignment device of claim 10 further comprising:
a first pusher support coupled to the first pusher and movably coupled to the frame and adapted to move along the first path of translation;
a second pusher support coupled to the second pusher and movably coupled to the frame and adapted to move along the second path of translation; and
a plunger adapted to urge the first and second pusher supports away from the support stage.

20. An alignment device adapted to laterally urge a substrate supported on a support stage so as to cause the substrate to slide relative to the support stage, comprising:
a first pusher adapted to contact an edge of a substrate supported on the support stage and to laterally translate along a first path of translation;
a second pusher adapted to contact the edge of the substrate and to laterally translate along a second path of translation, the second path of translation being at an angle to the first path of translation and intersecting the first path at a path intersection;
a frame to which the first and second pushers are movably coupled, the frame adapted to maintain the first and second pushers at an elevation of the edge of the substrate supported on the support stage;
a first biasing element coupled between the first pusher and the frame and adapted to bias the first pusher against the edge of the substrate;
a second biasing element coupled between the second pusher and the frame and adapted to bias the second pusher against the edge of the substrate independent of the biasing of the first pusher;
a first guide shaft adapted to define the first path of translation; and
a second guide shaft adapted to define the second path of translation.

21. An alignment device adapted to laterally urge a substrate supported on a support stage so as to cause the substrate to slide relative to the support stage, comprising:
a first pusher adapted to contact an edge of a substrate supported on the support stage and to laterally translate along a first path of translation;
a second pusher adapted to contact the edge of the substrate and to laterally translate along a second path of translation, the second path of translation being at an angle to the first path of translation and intersecting the first path at a path intersection;
a frame to which the first and second pushers are movably coupled, the frame adapted to maintain the first and second pushers at an elevation of the edge of the substrate supported on the support stage;
a first biasing element coupled between the first pusher and the frame and adapted to bias the first pusher against the edge of the substrate;
a second biasing element coupled between the second pusher and the frame and adapted to bias the second pusher against the edge of the substrate independent of the biasing of the first pusher;

a first pusher support coupled to the first pusher and movably coupled to the frame and adapted to move along the first path of translation;

a second pusher support coupled to the second pusher and movably coupled to the frame and adapted to move along the second path of translation;

a first stop plate coupled to the frame and adapted to limit movement of the first pusher support along the first path of translation away from the support stage; and a second stop plate coupled to the frame and adapted to limit movement of the second pusher support along the second path of translation away from the support stage.

22. An alignment device adapted to laterally urge a substrate supported on a support stage so as to cause the substrate to slide relative to the support stage, comprising:

a first pusher adapted to contact an edge of a substrate supported on the support stage and to laterally translate along a first path of translation;

a second pusher adapted to contact the edge of the substrate and to laterally translate along a second path of translation, the second path of translation being at an angle to the first path of translation and intersecting the first path at a path intersection;

a frame to which the first and second pushers are movably coupled, the frame adapted to maintain the first and second pushers at an elevation of the edge of the substrate supported on the support stage;

a first biasing element coupled between the first pusher and the frame and adapted to bias the first pusher against the edge of the substrate;

a second biasing element coupled between the second pusher and the frame and adapted to bias the second pusher against the edge of the substrate independent of the biasing of the first pusher;

a first pusher support coupled to the first pusher and movably coupled to the frame and adapted to move along the first path of translation;

a second pusher support coupled to the second pusher and movably coupled to the frame and adapted to move along the second path of translation; and a plunger adapted to urge the first and second pusher supports away from the support stage.

* * * * *